(12) United States Patent
Thorp et al.

(10) Patent No.: US 7,033,674 B2
(45) Date of Patent: Apr. 25, 2006

(54) ELECTRICAL DEVICES EMPLOYING MOLTEN COMPOSITIONS OF BIOMOLECULES

(75) Inventors: H. Holden Thorp, Chapel Hill, NC (US); Royce W. Murray, Pittsboro, NC (US); Anthony M. Leone, Chapel Hill, NC (US); Mary Elizabeth Williams, State College, PA (US)

(73) Assignee: The University of North Carolina at Chapel Hill, Chapel Hill, NC (US)

( * ) Notice: Subject to any disclaimer, the term of this patent is extended or adjusted under 35 U.S.C. 154(b) by 382 days.

(21) Appl. No.: 09/932,196

(22) Filed: Aug. 17, 2001

(65) Prior Publication Data

US 2004/0180224 A1 Sep. 16, 2004

Related U.S. Application Data

(60) Provisional application No. 60/226,113, filed on Aug. 18, 2000.

(51) Int. Cl.
  *B32B 15/04* (2006.01)
  *H01M 6/00* (2006.01)

(52) U.S. Cl. .................. 428/457; 428/447; 428/461; 429/102; 429/103; 429/104; 429/188; 429/300; 429/304

(58) Field of Classification Search ............ 428/457; 524/1; 429/102, 103, 104, 300, 304, 305, 429/188
See application file for complete search history.

(56) References Cited

U.S. PATENT DOCUMENTS

| | | | |
|---|---|---|---|
| 3,845,033 A | 10/1974 | Hamden et al. | |
| 5,310,608 A * | 5/1994 | Ishizawa et al. | 429/11 |
| 5,656,611 A | 8/1997 | Kabanov et al. | |
| 6,128,214 A | 10/2000 | Kuekes et al. | |
| 6,256,767 B1 | 7/2001 | Kuekes et al. | |
| 6,294,289 B1 * | 9/2001 | Fanta et al. | 429/188 |

FOREIGN PATENT DOCUMENTS

WO  WO 95/06056  3/1995

OTHER PUBLICATIONS

Karpinski, Zenon J., et al., *Electrochemical Studies of Iodine in an Aluminium Chloride-Butylpyridinium Chloride Ionic Liquid*, J. Electroanal. Chem., vol. 178, pp. 218-294 (1984).
Hyk, Wojciech, et al., *Physiochemical Consequences of Generating a Thin Layer of Ionic Liquid at Microelectrode Surface in Undiluted Redox Liquid*, J. Phys. Chem. B, vol. 102, pp. 577-584 (1998).
International Search Report for International Application Serial No. PCT/US01/25718 dated Aug. 23, 2002.

Adleman, Leonard M., *Molecular Computation of Solutions to Combinatorial Problems*, Science, vol. 266, pp. 1021-1024 (Nov. 11, 1994).
Beckman, Kenneth B., et al., *Oxidative Decay in DNA*, The Journal of Biological Chemistry, vol. 272, No. 32, pp. 19633-19636 (Aug. 8, 1997).
Chao, Shuchi, et al., *Solid-State Microelectrochemistry: Electrical Characteristics of a Solid-State Microelectrochemical Transistor Based on Poly(3-methylthiophene)*, J. Am. Chem. Soc., vol. 109, pp. 2197-2199 (1987).
Dickinson, Enders, et al., *Effect of Position of Polyether Attachment on the Electron Self-Exchange Activation Barrier Energies of Redox Polyether Hybrid Molten Salts*, J. Phys. Chem. B, vol. 103, pp. 11028-11035 (1999).
Dickinson, Enders, et al., *Hybrid Redox Polyether Melts Based on Polyether-Tailed Counterions*, J. Am. Chem. Soc., vol. 121, pp. 613-616 (1999).
Elghanian, Robert, et al., *Selective Colorimetric Detection of Polynucleotides Based on the Distance-Dependent Optical Properties of Gold Nanoparticles*, Science, vol. 277, pp. 1078-1081 (Aug. 22, 1997).
Fink, Hans-Werner, et al., *Electrical conduction through DNA molecules*, Nature, vol. 298, pp. 407-410 (Apr. 1, 1999).
Hall, Daniel B., et al., *Oxidative DNA damage through long-range electron transfer*, Nature, vol. 382, pp. 731-735 (Aug. 22, 1996).
Henle, Ernst S., et al., *Formation, Prevention, and Repair of DNA Damage by Iron/Hydrogen Peroxide*, The Journal of Biological Chemistry, vol. 272, No. 31, pp. 19095-19098 (Aug. 1, 1997).
Hopfield, J.J., et al., *A Molecular Shift Register Based on Electron Transfer*, Science, vol. 241, pp. 817-820 (Aug. 12, 1988).
Johnston, Dean H., et al., *Cyclic Voltammetry Studies of Polynucleotide Binding and Oxidation by Metal Complexes: Homogeneous Electron-Transfer Kinetics*, J. Phys. Chem., vol. 100, pp. 13837-13843 (1996).
Johnston, Dean H., et al., *Electrochemical Measurement of the Solvent Accessibility of Nucleobases Using Electron Transfer between DNA and Metal Complexes*, J. Am. Chem. Soc., vol. 117, pp. 8933-8938 (1995).

(Continued)

*Primary Examiner*—Monique R. Jackson
(74) *Attorney, Agent, or Firm*—Myers Bigel Sibley & Sajovec

(57) ABSTRACT

Compositions of biomolecules such as nucleic acids that form molten salts are provided. These compositions molten compositions that have useful electrical properties. Such compositions include a salt of (i) an organic polymer ion such as a polynucleic acid anion, and (ii) a polyether or polysiloxane couterion. Methods of making and using such compositions, along with electrical devices such as memory devices, are also provided.

41 Claims, 6 Drawing Sheets

OTHER PUBLICATIONS

Johnston, Dean H., et al., *Trans-Dioxorhenium (V)-Mediated Oxidation at Indium Tin-Oxide Electrodes: Voltammetric Detection of DNA Cleavage in Solution*, Inorg. Chem., vol. 33, pp. 6388-6390 (1994).

Jortner, Joshua, et al., *Charge transfer and transport in DNA*, Proc. Natl. Acad. Sci. USA, vol. 95, pp. 12759-12765 (Oct. 1998).

Leone, Anthony M., et al., *An Ionic Liquid Form of DNA: Redox-Active Molten Salts of Nucleic Acids*, J. Am. Chem. Soc., vol. 123, No. 2, pp. 218-222 (2001).

Lewis, Frederick D., et al, *Distance-Dependent Electron Transfer in DNA Hairpins*, Science, vol. 277, pp. 673-676 (Aug. 1, 1997).

Lewis, Frederick D., et al., *Direct measurement of hole transport dynamics in DNA*, Nature, vol. 406, pp. 51-53 (Jul. 6, 2000).

Manning, Gerald S., *The Molecular theory of polyelectrolyte solutions with applications to the electrostatic properties of polynucleotides*, Quarterly Reviews of Biophysics II, vol. 2, pp. 179-246 (1978).

Meggers, Eric, et al., *Sequence Dependent Long Range Hole Transport in DNA*, J. Am. Chem. Soc., vol. 120, pp. 12950-12955 (1998).

Mirkin, Chad A., et al., *Semiconductors meet biology*, Nature, vol. 405, pp. 626-627 (Jun. 8, 2000).

Mirkin, Chad A., *Programming the Assembly of Two- and Three-Dimensional Architectures with DNA and Nanoscale Inorganic Building Blocks*, Inorg. Chem., vol. 39, pp. 2258-2272 (2000).

Okahata, Yoshio, et al., *Anisotropic Electric Conductivity in an Aligned DNA Cast Film*, J. Am. Chem. Soc., vol. 102, pp. 6165-6166 (1998).

Payti, Radha, et al., *Voltammetry and Conductivity of a Polyether Pyridinium Room Temperature Molten Salt Electrolyte and of its Polymer Electrolyte Solutions in Polydimethylsiloxane*, J. Electrochem. Soc., vol. 143, No. 2, pp. 401-405 (Feb. 1996).

Pirrung, Michael C., et al., *The Arrayed Primer Extension Method for DNA Microchip Analysis. Molecular Computation of Satisfaction Problems*, J. Am. Chem. Soc., vol. 122, pp. 1873-1882 (2000).

Porath, Danny, et al., *Direct Measurement of electrical transport through DNA molecules*, Nature, vol. 403, pp. 635-638 (2000).

Record, Jr., M. Thomas, et al., *Thermodynamic analysis of ion effects on the binding and conformational equilibria of proteins and nucleic acids: the roles of ion association or release, screening, and ion effects on water activity*, Quarterly Reviews of Biophysics II, vol. II, pp. 103-178 (1978).

Ritchie, Jason E., et al., *Intermolecular Optical Electron Transfer in Polyether Hybrid Molten Salts of Mixed-Valent Ruthenium Complexes*, J. Am. Chem. Soc., vol. 122, pp. 2964-2965 (2000).

Saito, Isao, et al., *Photoinduced DNA Cleavage via Electron Transfer: Demonstration That Guanine Residues Located 5' to Guanine Are the Most Electron-Donating Sites*, J. Am. Chem. Soc., vol. 117, pp. 6406-6407 (1995).

Schuster, Gary B., *Long-Range Charge Transfer in DAN: Transient Structural Distortions Control the Distance Dependence*, Acc. Chem. Res., vol. 33, No. 4, pp. 253-260 (2000).

Williams, Mary Elizabeth, et al., *Electron and Mass Transport in Hybrid Redox Polyether Melts: Co and Fe Bipyridines with Attached Polyether Chains*, J. Am. Chem. Soc., vol. 119, pp. 1997-2005 (1997).

\* cited by examiner

ELECTRICAL DEVICES EMPLOYING MOLTEN COMPOSITIONS OF BIOMOLECULES

RELATED APPLICATIONS

This application claims the benefit of U.S. Provisional Application No. 60/226,113, filed Aug. 18, 2000, the disclosure of which is incorporated herein by reference in its entirety.

GOVERNMENT SUPPORT

This invention was made with Government support under contract DAMD17-91-8224 from the U.S. Army Medical Research and Materiel Command. The Government has certain rights to this invention.

FIELD OF THE INVENTION

The present invention relates to electrical devices, melt compositions of biomolecules such as nucleic acids, methods of making and using the same, and structures or devices incorporating the same.

BACKGROUND OF THE INVENTION

Nucleic acids may typically be manipulated in aqueous solution and may generally be associated with metal cations. For example, compositions of DNA may typically contain alkali metal countercations that render DNA a crystalline solid that is soluble only in water.

In Gerald S. Manning, et al., "The Molecular Theory of Polyelectrolyte Solutions with Applications to the Electrostatic Properties of Polynucleotides", *Quarterly Review of Biophysics II*, 2:179–246 (1978), the authors discuss binding of various cationic substances with DNA in an aqueous environment. These cationic substances include metal cations, small cations with complex structures such as oligolysine and spermine, as well as high-molecular-weight cations such as polylysine.

In M. Thomas Record, et al., "Thermodynamic Analysis of Ion Effects on the Binding and Conformational Equilibria of Proteins and Nucleic Acids: The Roles of Ion Association or Release, Screening, and Ion Effects on Water Activity", *Quarterly Review of Biophysics II*, 2:103–178 (1978), the authors discuss the various effects of low-molecular-weight electrolytes in the associations and interactions of proteins and nucleic acids.

In Enders Dickinson, V, et al., "Hybrid Redox Polyether Melts Based on Polyether-Tailed Counterions", *J. Am. Chem. Soc.* 121:613–616 (1999), the authors propose transforming various ionic materials into room temperature molten salts by combining them with polyether-tailed counter ions such as polyether-tailed 2-sulfobenzoate and polyether-tailed triethylammonium. The ionic materials include ruthenium hexamine, metal trisbipyridines, metal trisphenanthrolines, and ionic forms of aluminum quinolate, anthraquinone, phthalocyanine, and porphyrins. The authors do not describe transforming nucleic acids into molten salts.

In Mary Elizabeth Williams, et al., "Electron and Mass Transport in Hybrid Redox Polyether Melts: Co and Fe Bipyridines with Attached Polyether Chains", *J. Am. Chem. Soc.*, 119: 1997–2005 (1997), the authors discuss how to discern charge transport by electron self exchange reactions from transport by physical diffusion so as to measure electron transfer rate constants in a series of undiluted metal complex molten salts $[M(bpy(CO_2MePEG)_2)_3]^+ (ClO_4)_2^-$ where $M=Co(II/I)$ and $Fe(III/II)$ and MePEG is an oligomeric polyether of MW 150, 350, and 550 (the cation portion of which is shown below). In Enders Dickinson V, et al., "The Effect of Polyether Attachment on the Self-Exchange Barriers of Metal Tris(bipyridine) Molten Salts", *J. Phys. Chem.*, 103:11028–11035 (1999), the authors propose highly viscous, room temperature molten salts that may be obtained by associating $[M(bpy)_3]^{2+}$ cations (where M=Ru or Co and bpy=2,2'-bipyridine) with polyether-tailed 2-sulfobenzoate anions. These articles do not discuss molten salts of nucleic acids, nor do the authors appear to recognize the benefits of forming redox-active melts where both the cation and the anion may be capable of electron transfer.

In Yoshio Okahata, et al., "Anisotropic Electric Conductivity in an Aligned DNA Cast Film", *J. Am. Chem. Soc.*, 120: 6165–6166 (1998), the authors propose an aligned DNA film as an anisotropic conductive film, in which counter $Na^+$ cations were exchanged completely to cationic amphiphiles. The authors report that the aligned DNA film was prepared as follows. An aqueous solution of DNA from Salmon testes (average MW $1.3 \times 10^6$, ca. 2000 bp) was mixed with an aqueous solution of a cationic amphiphile, N,N,N-trimethyl-N-(3,6,9,12-tetraoxadocosyl) ammonium bromide, $(CH_3)_3N(CH_2CH_2O)_4(CH_2)_9(CH^3)^+Br^-$. The precipitate DNA-lipid polyion complex (1:1 ratio of phosphate anion to cationic amphiphile) was collected and solubilized in chloroform/ethanol (4:1 v/v). The solution (40 mg/mL, 4 wt %) was cast on a Teflon plate, and the solvent was evaporated slowly under saturated solvent vapor at room temperature. The obtained self-standing film (ca. 60 microns thick) was transparent, flexibly strong, and water-insoluble. The reference does not propose molten salts of polynucleic acids that are liquid. Furthermore, the precipitated DNA-lipid polyanion complex discussed by the authors is not soluble in water.

Various references have discussed the possibility of electron transport through DNA. For example, in Danny Porath, et al., "Direct Measurement of Electrical Transport Through DNA Molecules", *Nature*, 403: 635–638 (2000), the authors present measurements of electrical transport through individual 10.4 nm-long, double-stranded poly(G)-poly(C) DNA molecules connected to two metal nanoelectrodes, that may indicate large-bandgap semiconducting behavior. In Frederick D. Lewis, et al., "Distance-Dependent Electron Transfer in DNA Hairpins", *Science*, 277: 673–676 (1997), the authors discuss the distance dependence of photoinduced electron transfer in duplex DNA, and state that while kinetic analysis suggests that duplex DNA is somewhat more effective than proteins as a medium for electron transfer, it does not function as a molecular wire. In Joshua Jortner, et al., "Charge Transfer and Transport in DNA", *Proc. Natl. Acad. Sci.*, 95: 12759–12765 (1998), the authors explore charge migration in DNA and advance two distinct mechanisms of charge separation in a donor-bridge-acceptor system. In Daniel B. Hall, et al., "Oxidative DNA Damage Through Long-range Electron Transfer", *Nature*, 382: 731–735 (1996), the authors note that the DNA double helix, which contains a π-stacked array of heterocyclic base pairs, could be a suitable medium for the migration of charge over long molecular distances. In Hans-Werner Fink & Christian Schonenberger, "Electrical Conduction Through DNA Molecules", *Nature*, 398: 407–410 (1999), the authors report direct measurements of electrical current as a function of the potential applied across a few DNA molecules associated into single ropes at least 600 nm long, which indicate effective conduction through the ropes. In Gary B. Schuster, "Long-Range Charge Transfer in DNA: Transient Structural Distortions Control the Distance Dependence, *Acc. Chem. Res.*, 33: 253–260 (2000), the author proposes a mechanism for long-range charge transport in DNA that depends on its spontaneous structural distortion. This mechanism is referred to as phonon-assisted polaron hopping. In Frederick D. Lewis, et al., "Direct Measurement of Hole Transport Dynamics in DNA", *Nature*, 406: 51–53 (2000), the authors propose that electrons and holes can migrate from the locus of formation to trap sites, and such migration can occur through either a single step "super exchange" mechanism or a multistep charge transport "hopping" mechanism. These references do not describe molten salts of nucleic acids, and do not suggest how to obtain such molten salts.

Several authors have proposed the use of nucleic acids in molecular electronics. For example, in Robert Elghanian, et al., "Selective Colorimetric Detection of Polynucleotides Based on the Distance-Dependent Optical Properties of Gold Nanoparticles", *Science*, 277: 1078–1081 (1997), the authors discuss the use of nucleic acids to form a polymeric network of nanoparticles. In Chad A Mirkin, "Programming the Assembly of Two- and Three-Dimensional Architectures with DNA and Nanoscale Inorganic Building Blocks", *Inorg. Chem.*, 39:2258–2272 (2000), the author discusses the development of biological-based methods for directing the assembly of nanoscale inorganic building blocks into functional materials. The author proposes using DNA as a synthetically programmable assembler. In J. J. Hopfield, et al., "A Molecular Shift Register Based on Electron Transfer", *Science*, 241: 817–820 (1988), the authors propose an electronic shift-register memory at the molecular level. The authors mention that one scheme to build such a register may take advantage of the linear structure of DNA to which sequence-specific chromophore-bearing groups could be bound. However, methods for carrying out such a scheme are not provided. In Leonard M. Adelman, "Molecular Computation of Solutions to Combinatorial Problems", *Science*, 266: 1021–1024 (1994), the author proposes carrying out computations at the molecular level using the tools of molecular biology to solve an instance of the directed Hamiltonian path problem. A small graph was encoded in molecules of DNA, and the "operations" of the computation were performed with standard protocols and enzymes. In Michael C. Pirrung, et al., "The Arrayed Primer Extension Method for DNA Microchip Analysis: Molecular Computation of Satisfaction Problems", *J. Am. Chem. Soc.*, 122: 1873–1882 (2000), the authors discuss a DNA computer which may be capable of solving nondeterministic polynomial time (NP)-complete problems (those whose time-complexity function rises exponentially with the problem size) in polynomial time using an arrayed primer extension method. These methods are based on template-dependent extension of DNA primers bound to a solid phase with a labeled dideoxyribonucleotide terminator, followed by detection of the label so added. These references do not describe molten salts of nucleic acids, nor do they appear to recognize the usefulness of such molten salts in molecular electronic applications.

SUMMARY OF THE INVENTION

A first aspect of the invention is a composition comprising a salt of an organic polymer ion and a polymer (generally polyether or polysiloxane) counterion; the organic polymer ion selected from the group consisting of polypeptides, polynucleic acids, polystyrenes, and polysaccharides (these including copolymers thereof or compounds to which other groups have been joined, such as glycoproteins); wherein at least one of the organic polymer ion and the polymer counterion is redox active, and having the general formula $X^{\pm}Z^{\pm}$, where X is an organic polymer ion and Z is a polymer counterion, subject to the proviso that when X is positively charged then Z is negatively charged, and when X is negatively charged then Z is positively charged ("charge" herein referring to a net positive or negative charge; for example a net positive or negative charge resulting from an absence or excess of electrons, respectively, or a net positive charge (creating a cation) or a net negative charge (creating an anion)). In general, the composition is a melt, preferably at temperatures at which electronic devices such as computers are typically used (e.g., about −50 or −25 to about 100° C.). In some embodiments, the organic polymer ion is an anion and the counterion is a cation; In other embodiments, the organic polymer ion is a cation and the counterion is an anion. In some embodiments either the organic polymer ion is redox active or the polyether counterion is redox active; in other embodiments, both the organic polymer ion and the polyether counterion are redox active. The molar ratio of the organic polymer ion to the polymer counterion (e.g., X and Z in the general formula above) in the composition may be any suitable ratio, such as from about 20:1 or 10:1 to about 1:10 or 1:20. The organic polymer ion may have any suitable molecular weight, such as from about 1, 10 or 100 to 1,000, 10,000, or 100,000 kilodaltons, or more. The polymer counterion may likewise have any suitable molecular weight such as from about 0.2, 0.3, 1, 10 or 100 to 1,000, 10,000, or 100,000 kilodaltons, or more.

A further aspect of the invention is a method of depositing a material on a substrate, comprising the step of coating at least one surface portion of a substrate with a composition described above. The method may optionally further include the step of solidifying the composition on the substrate. In general, the substrate is a solid substrate and the at least one surface portion is an external surface portion, or the substrate may be a porous substrate and the at least one surface portion may include an internal surface portion. The substrate may be a metal, semiconductor, polymeric, or any other suitable material.

A further aspect of the present invention is a structure comprising: (a) a substrate; and (b) a coating on the substrate, the coating comprising a composition as described above. In one embodiment, the substrate is an electrode.

A further aspect of the present invention is a method of making a molten salt, the method comprising the steps of: (a) providing an organic polymer ion selected from the group consisting of polypeptides, polynucleic acids, polystyrenes, and polysaccharides; (b) providing a polymer (typically a polyether or polysiloxane) counterion; and (c) combining the organic polymer ion with the polymer counterion to make a molten salt thereof.

A further aspect of the present invention is a method of forming a structure, comprising the steps of: (a) forming a molten salt of a composition as described above, and (b) solidifying, immobilizing, applying or shaping the molten salt to form a structure.

A further aspect of the present invention is an electrical device such as a memory device, the device comprising: (a) a first electrode; (b) a storage medium electrically coupled to the electrode, the storage medium comprising an ionic liquid melt (including but not limited to the compositions described above), the ionic liquid melt comprising at least a first redox active compound. The device may include a second electrode electrically coupled to the storage medium. In some embodiments, the storage medium is contained within an enclosed and/or sealed chamber. In some embodiments, the ionic liquid melt further comprises a second redox active compound that together with the first redox active compound form a redox active pair. Such a device may be a refreshable memory device. In general, the storage medium is not covalently bonded to the first electrode.

A more particular aspect of the present invention is a composition comprising a salt, for example a molten salt, of a polynucleic acid anion and a polyether cation. The polyether cation may have a polyether tail group having the formula:

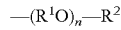

wherein: $R^1$ is a substituted or unsubstituted, linear or branched, aliphatic or cycloaliphatic group, having between 1 and 10 carbons, that is saturated, partially saturated, or unsaturated; $R^2$ is a substituted or unsubstituted, linear or branched, aliphatic or cycloaliphatic group, having between 1 and 8 carbons, that is saturated, partially saturated, or unsaturated; and n is typically an integer between 1, 2 or 3 and 15, 25 or 50. In addition to the foregoing, analogous materials in which the tail is a siloxane (such as polydimethylsiloxane) rather than a polyether may also be prepared.

The polynucleic acid may be polydeoxyribonucleic acid, polyribonucleic acid, etc. The polyether tail group may comprise polyethylene or polypropylene glycol. In a particular embodiment, $R^1$ is an unsubstituted, saturated $C_1$ to $C_4$ alkyl group. In another particular embodiment, $R^2$ is an unsubstituted, saturated $C_1$ to $C_8$ alkyl group. In another particular embodiment, $R^2$ is an unsubstituted, saturated $C_1$ to $C_4$ alkyl group such as a methyl group.

A further aspect of the present invention is a composition, preferably comprising a salt of a polynucleic acid anion and a polyether cation, said salt in the absence of any diluting solvent preferably being present as a molten salt. In a particular embodiment, the salt is amorphous (non-crystalline) and has a glass transition temperature between about $-50$ or $-25$ and $100°$ C. (i.e., temperatures at which electronic devices such as computers are typically used).

A further aspect of the present invention is a method of depositing a polynucleic acid on a substrate, comprising the step of: coating at least one surface portion of a substrate with a composition comprising a salt of a polynucleic acid anion and a polyether cation, said salt being present as a molten salt. The coating step may be followed by the step of solidifying, adhering and/or immobilizing the composition on said substrate. In a preferred embodiment, the substrate is a solid substrate and said at least one surface portion is an external surface portion. The substrate may also be a porous substrate, and said at least one surface portion may include an internal surface portion (e.g., a interior wall of a pore). Suitable substrates include but are not limited to metals, semiconductors, and polymeric materials. In a particular embodiment, the substrate comprises an electrode.

A further aspect of the present invention is a method of making a nucleic acid molten salt, said method comprising the steps of: (a) providing a nucleic acid; (b) providing a polyether cation, wherein said polyether cation has a polyether tail group as described above; and then (c) combining said nucleic acid with said polyether cation to make a nucleic acid salt that is a molten salt.

A further aspect of the present invention is a structure, comprising: (a) a substrate; and (b) a solid coating on said substrate, said solid coating comprising a salt of a polynucleic acid anion and a polyether cation, said salt having a glass transition temperature between about $-50$ or $-25$ and $100°$ C. The substrate may comprise an electrode.

A still further aspect of the present invention is a method of forming a structure, comprising the steps of: (a) forming a molten salt comprising a polynucleic acid anion and a polyether cation, wherein said polyether cation has a polyether tail group as described above; and (b) solidifying the molten salt to form a structure (e.g., by solidifying the molten salt on a substrate to form a structure).

The present invention is explained in greater detail in the drawings herein and the specification set forth below.

DETAILED DESCRIPTION OF THE PREFERRED EMBODIMENTS

Figure 1:
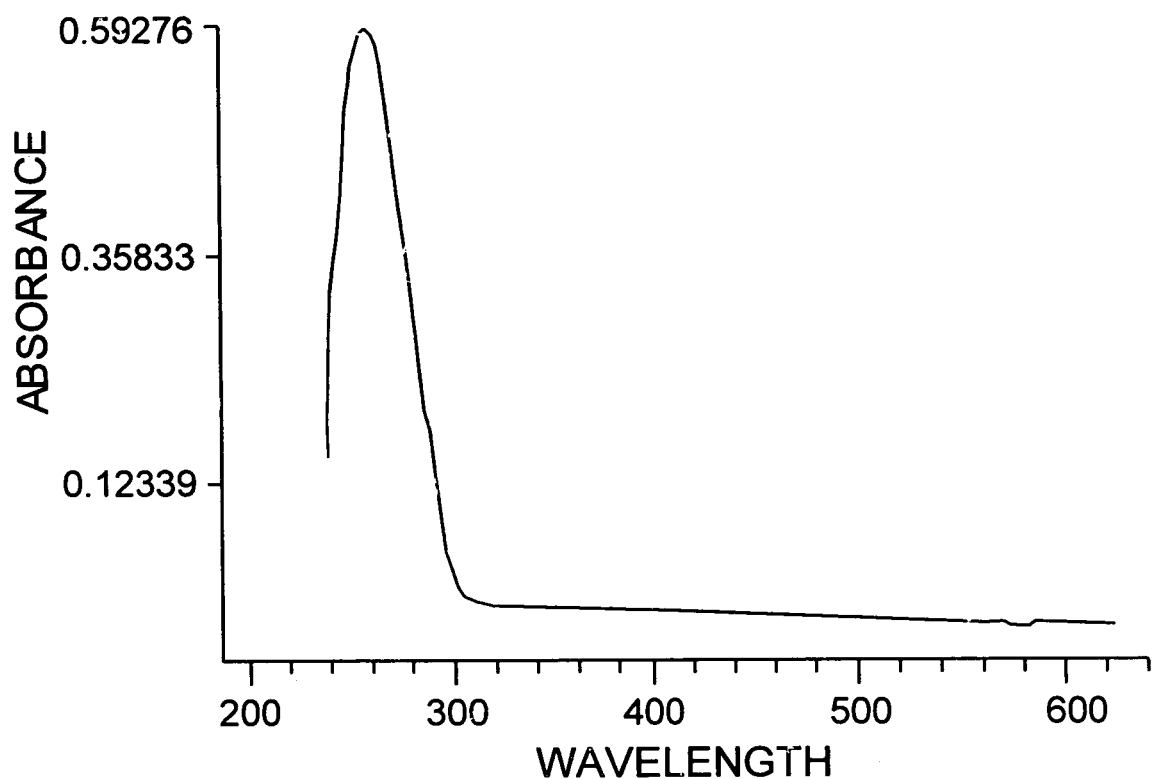
FIG. 1 shows the absorbance spectrum of a film of neat ammonium-polyethylene glycol methyl ether (MePEG) salt of herring testes (HT) DNA applied to a quartz microscope slide. Absorbances were monitored from 240 nm to 620 nm. Absorbance units are in optical density and wavelengths are in nanometers.

The term "polyether" or "polyether tail" as used herein means a group having the general formula:

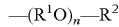

$R^1$ may be a substituted or unsubstituted, linear or branched, aliphatic or cycloaliphatic group, having between 1 and 10 carbons, that is saturated, partially saturated, or unsaturated. Preferably, $R^1$ is an unsubstituted, saturated aliphatic group. More preferably, $R^1$ is an unsubstituted, saturated $C_1$ to $C_{10}$ alkyl group. Most preferably, $R^1$ is an unsubstituted, saturated $C_1$ to $C_4$ alkyl group. $R^2$ may be a substituted or unsubstituted, linear or branched, aliphatic or cycloaliphatic group, having between 1 and 8 carbons, that is saturated, partially saturated, or unsaturated. $R^2$ is preferably an unsubstituted, saturated $C_1$ to $C_8$ alkyl. More preferably, $R^2$ is an unsubstituted, saturated $C_1$ to $C_4$ alkyl group, and, most preferably, $R^2$ is a methyl group. The variable n is an integer that is preferably between 1 and 50, more preferably between 2 and 25, and most preferably between 2 and 15. The average molecular weight of the polyethers of the present invention is preferably between 50 and 1,000 grams/mole, more preferably between 100 and 600 grams/mole, and most preferably between 150 and 550 grams/mole. A most preferred polyether is the monomethyl polyethylene glycol methyl ether MePEG$_{350}$ (MW=350) commercially available from Sigma-Aldrich of Milwaukee, Wis.

Polymer counterions ($Z^{\pm}$) are generally compounds of the formula PI$^{\pm}$, where P is a polyether or polysiloxand group and I is a charged group (+ or −) such as an ammonium or sulfonate group.

The terms "polyether cation" or "polymer cation" as used herein mean a cationic substance functionalized with one or more polyether (or other polymer) tails. The cationic substance may be various cations, including, but not limited to transition metal complexes, ammonium cations, crown ether-metal complexes, viologens, imidazolium, and porphyrins.

The ammonium cation has the formula:

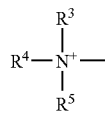

$R^3$, $R^4$, and $R^5$ may independently be hydrogen, or a substituted or unsubstituted aliphatic or cycloaliphatic group that is saturated, partially saturated, or unsaturated. The aliphatic group is preferably an unsubstituted, saturated $C_1$–$C_{10}$ alkyl, more preferably an unsubstituted, saturated $C_1$–$C_5$ alkyl, and, most preferably, an unsubstituted, saturated $C_1$–$C_3$ alkyl. A particularly preferred alkylammonium polyether cation has the formula:

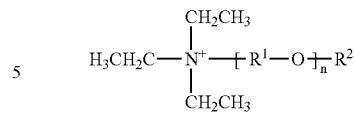

where $R^1$, $R^2$ and n are as described above.

The transition metal complexes according to embodiments of the present invention have a general formula of M-L, where M is a transition metal cation and L is one or more ligands. Preferably, the transition metal cation is a cation of a transition metal selected from the group consisting of chromium, manganese, iron, cobalt, nickel, ruthenium, osmium, rhodium, iridium, copper and zinc cations. More preferably, the transition metal cation is a cation selected from the group consisting of iron and cobalt cations. Most preferably, the transition metal cation is selected from the group consisting of iron(II) and cobalt(II) cations. According to the present invention, the transition metals may be complexed with a variety of ligands to form suitable transition metal complexes, as is well known in the art. In general, ligands of the present invention may be various coordinating ligands that are capable of covalently binding to the chosen metal and are also capable of being bound to a polyether tail. Suitable ligands include, but are not limited to, pyridine, bipyridine and substituted derivatives of bipyridine, pyrazine, isonicotinamide, imidazole, phenanthrolines and substituted derivatives of phenanthrolines, dipyridophenazine, 1,4,5,8,9,12-hexaazatriphenylene (abbreviated hat), 9,10-phenanthrenequinone diimine, 1,4,5,8-tetraazaphenanthrene (abbreviated tap); 1,4,8,11-tetraazacyclotetradecane; diaminopyridine (abbreviated damp); porphyrins and substituted derivatives of the porphyrin family. Preferably, the ligands are substituted derivatives of bipyridine. More preferably, the ligand is 4,4'-dicarboxy-2,2'-bipyridine. A particularly preferred transition state metal polyether cation is a complex of iron(II) or cobalt(II) and 4,4'-dicarboxy-2,2'-bipyridine, as illustrated in the following formula:

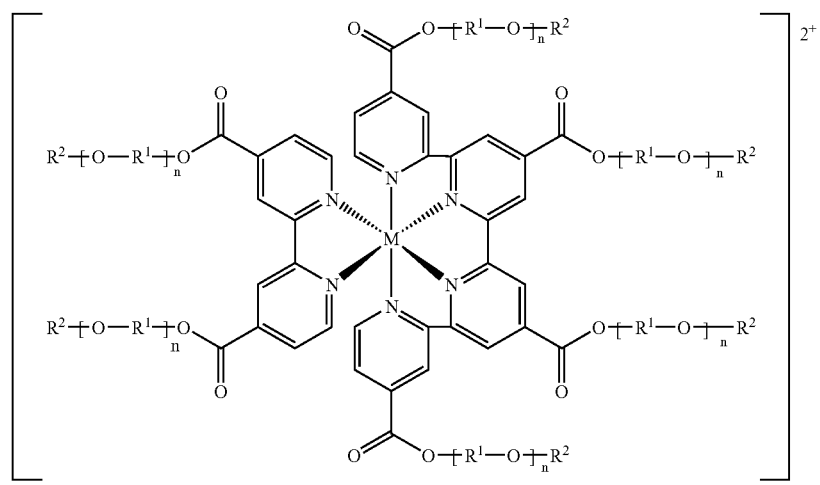

where $R^1$, $R^2$ and n are as described above, and M is Fe(II) or Co(II).

"Molten salt" or "salt in a molten phase" or "melt" as used herein means a salt that is present as a non-aqueous liquid. Molten salts of the present invention may have thermal transition temperatures between −100 and 300° C., or more, but are preferably between about −50 or −25 and 100° C. As used herein, "thermal transition temperature" is the temperature at which a material undergoes a transition from crystalline or partly crystalline to non-crystalline or the temperature at which the material transitions from a glassy state with restricted polymer chain motions to a molten state with freer polymer chain motions. Molten salts of the present invention have thermal transition temperatures preferably between −50 and 200° C., more preferably between −25 and 100° C., and most preferably between 0 and 50° C. Particularly preferred molten salts of the present invention have thermal transition temperatures between about 5 and 35° C. It may be preferable to mix molten salts of the present invention with various other salts in order to form a salt mixture having a particularly desirable melting point. For example, it may be desirable to form a mixture having a melting point such that the salt mixture is a molten salt at or near room temperature (i.e., between 15 and 35° C.). Such a mixture could be applied to a substrate at room temperature. Alternatively, it may be desirable to form a mixture having a higher melting point such that the salt mixture is a solid or semi-solid at or near room temperature, or at or near the operating temperature range for a given device. Such a mixture could be applied as a molten salt at the higher temperature, and be utilized as a solid or semi-solid at the lower room temperature or within the lower operating temperature range.

"Polynucleic acid" as used herein refers to any natural or synthetic polynucleic acid, including but not limited to polydeoxyribonucleic acid (DNA), polyribonucleic acid (RNA), etc. Polynucleic acids used to carry out the present invention may be of any suitable length, e.g., from two, three or four nucleotide bases in length, up to 110,000 or 20,000 bases in length or more (e.g., including genomic nucleic acids). In preferred embodiments, polynucleic acids used to carry out the present invention have a length that is preferably between about 2 and 1500 nucleotide bases, more preferably between about 10 and 750 nucleotide bases, and most preferably between about 25 and 250 nucleotide bases. As polynucleic acid lengths may affect the melting point of the resulting polynucleic acid salts of the present invention, these preferred lengths, particularly the most preferred lengths, may provide polynucleic acid salts that are liquid at desirable temperatures (e.g., at or near room temperature). The polynucleic acid may be single stranded or double stranded. Additional compounds or binding factors (e.g., proteins) may be bound to the polynucleic acid if desired. The polynucleic acid has at least two nucleotides covalently linked together. A polynucleic acid of the present invention will generally contain phosphodiester bonds, although in some cases, as outlined below, polynucleic acid analogs are included that may have alternate backbones, comprising, for example, phosphoramide (Beaucage, et al., *Tetrahedron*, 49(10):1925 (1993) and references therein; Letsinger, *J. Org. Chem.*, 35:3800 (1970); Sprinzl, et al., *Eur. J. Biochem.*, 81:579 (1977); Letsinger, et al., *Nucl. Acids Res.*, 14:3487 (1986); Sawai, et al., *Chem. Lett.*, 805 (1984), Letsinger, et al., *J. Am. Chem. Soc.*, 110:4470 (1988); and Pauwels, et al., *Chemica Scripta*, 26:141 (1986)), phosphorothioate (Mag, et al., *Nucleic Acids Res.*, 19:1437 (1991); and U.S. Pat. No. 5,644,048), phosphorodithioate (Briu, et al., *J. Am. Chem. Soc.*, 111:2321 (1989)), o-methylphosphoroamidite linkages (see Eckstein, Oligonucleotides and Analogues: A Practical Approach, Oxford University Press), and peptide nucleic acid backbones and linkages (see Egholm, *J. Am. Chem. Soc.*, 114:1895 (1992); Meier, et al., *Chem. Int. Ed. Engl.*, 31:1008 (1992); Nielsen, *Nature*, 365:566 (1993); Carlsson, et al., *Nature*, 380:207 (1996), all of which are incorporated by reference)). Other analog polynucleic acids include those with positive backbones (Denpcy, et al., *Proc. Natl. Acad. Sci. USA*, 92:6097 (1995)); non-ionic backbones (U.S. Pat. Nos. 5,386,023; 5,637,684; 5,602,240; 5,216,141; and 4,469,863; Kiedrowski, et al., *Angew. Chem. Intl. Ed. English*, 30:423 (1991); Letsinger, et al., *J. Am. Chem. Soc.*, 110:4470 (1988); Letsinger, et al., Nucleoside & Nucleotide, 13:1597 (1994); Chapters 2 and 3, ASC Symposium Series 580, "Carbohydrate Modifications in Antisense Research," Ed. Y. S. Sanghui and P. Dan Cook; Mesmaeker, et al., *Bioorganic & Medicinal Chem. Lett.*, 4:395 (1994); Jeffs, et al., *J. Biomolecular NMR*, 34:17 (1994); Tetrahedron Lett., 37:743 (1996)) and non-ribose backbones, including those described in U.S. Pat. Nos. 5,235,033 and 5,034,506, and Chapters 6 and 7, ASC Symposium Series 580, "Carbohydrate Modifications in Antisense Research," Ed. Y. S. Sanghui and P. Dan Cook. Polynucleic acids containing one or more carbocyclic sugars are also included within the definition of polynucleic acids (see Jenkins, et al., *Chem. Soc. Rev.*, (1995) pp. 169–176). Several polynucleic acid analogs are described in Rawls, *C & E News*, Jun. 2, 1997, page 35. These modifications of the ribose-phosphate backbone may be done to facilitate the addition of additional moieties such as labels, or to increase the stability and half-life of such molecules in physiological environments. In addition, mixtures of naturally occurring polynucleic acids and analogs can be made. Alternatively, mixtures of different polynucleic acid analogs, and mixtures of naturally occurring polynucleic acids and analogs may be made. The polynucleic acids may be single stranded or double stranded, as specified, or contain portions of both double stranded or single stranded sequence. The polynucleic acid may be DNA, both genomic and cDNA, RNA or a hybrid, where the polynucleic acid contains any combination of deoxyribo- and ribo-nucleotides, and any combination of bases, including uracil, adenine, thymine, cytosine, guanine, inosine, xathanine hypoxathanine, isocytosine, isoguanine, etc. The terms "polynucleic acid", "nucleic acid", "oligonucleotide" or grammatical equivalents may be used interchangeably herein.

According to the present invention, polyether cations may be combined with polynucleic acid anions to form novel molten salts of polynucleic acids. Preferably, novel molten salts of polynucleic acids are formed by cation exchange of native sodium associated with polynucleic acid anions for polyether cations. In performing the cation exchange, the polyether cation and polynucleic acid may be mixed in various ratios. Preferably the ratio of polynucleic acid: polyether cation is between 1:10, 1:9, 1:8, 1:7 or 1:6 and 10:1, 9:1, 8:1, 7:1 or 6:1, more preferably the ratio is between 1:5, 1:4 or 1:3 and 5:1, 4:1 or 3:1, and, most preferably, the ratio is between 1:2 and 2:1. The cation exchange may be performed using various methods, as will be understood by those skilled in the art, including, but not limited to dialysis, ultrafiltration, ion-exchange chromatography, and precipitation, to name just a few. Preferably, the cation exchange is performed in an aqueous solution using a dialysis method. Dialysis may be preferred over other methods such as precipitation when the resulting DNA molten salt forms a liquid at the conditions under which the cation exchange occurs. Dialysis may be performed as long as necessary to achieve the desired level of cation exchange. Dialysis is performed for a period of time preferably between 1 and 30 days, more preferably between 3 and 15 days, and most preferably between 5 and 10 days. The level of cation exchange (i.e., purity) of the resulting molten salt of a polynucleic acid is a measure of the percentage of polyether cation-polynucleic acid salt in the molten salt compound. The purity of the resulting molten salt of polynucleic acid may be between 1 and 100%, and is preferably greater than 50%, more preferably greater than 75% and most preferably greater than 90%.

Polynucleic acid molten salts of the present invention may be present in substantially pure form, or may be present in a mixture of molten salts. The mixture of molten salts may contain one or more polynucleic acid molten salts as well as non-polynucleic acid molten salts. When the mixture contains both polynucleic acid and non-polynucleic acid molten salts, the ratio of polynucleic acid molten salts to non-polynucleic acid molten salts is preferably between 1:10, 1:9, 1:8, 1:7 or 1:6 and 10:1, 9:1, 8:1, 7:1 or 6:1, more preferably the ratio is between 1:5, 1:4 or 1:3 and 5:1, 4:1 or 3:1, and, most preferably, the ratio is between 1:2 and 2:1. When one or more of the polynucleic acid molten salts contains one or more guanine bases, one or more of the non-polynucleic acid molten salts preferably contains an oxidant to oxidize the guanine base(s), or a substance which can be chemically or electrochemically converted to an oxidant. Such mixtures may produce electrons by electrocatalytic oxidation of the guanine base(s). Preferably, the non-polynucleic acid molten salt is selected from the group consisting of $Fe(MePEG-bpy)_3(ClO_4)_2$, $Ru(MePEG-bpy)_3(ClO_4)_2$, $Os(MePEG-bpy)_3(ClO_4)_2$, and mixtures thereof. Polynucleic acid molten salts of the present invention may also include additives (e.g., small molecule plasticizers or unattached polyethylene glycol plasticizers) which may allow the fluidity, the ionic conductivity, and/or the thermal transition temperatures to be adjusted as desired. These additives are preferably present in concentrations less than 10% and more preferably less than 5% by weight. Although polynucleic acid molten salts of the present invention are preferably liquid, polynucleic acid molten salts of the present invention may have a great range of associated viscosity, which can be so high as to constitute a semi-solid or a glassy solid.

According to the present invention, when complexed with cations that contain poly(ether) functionality, polynucleic acids form novel phases that are molten and are readily soluble in a wide variety of non-aqueous media. Suitable non-aqueous media include, but are not limited to, monohydric alcohols such as methanol, ethanol, 1-propanol, 2-propanol, 1-butanol, 1-hexanol, 1-octanol, and trifluoroethanol; polyhydric alcohols such as propylene glycol, PEG 400, and 1,3-propanediol; ethers such as tetrahydrofuran (THF), diethyl ether, and diglyme; alkanes such as decalin, isooctane, and mineral oil; aromatics such as benzene, toluene, chlorobenzene, and pyridine; amides such as n-methylpyrrolidone (NMP), and N,N-dimethylformamide (DMF); esters such as ethyl acetate and methyl acetate; chlorocarbons such as $CH_2Cl_2$, $CHCl_3$, $CCl_4$, and 1,2-dichloroethane; and others such as nitromethane, acetone, ethylene diamine, acetonitrile, and trimethyl phosphate.

Figure 2:
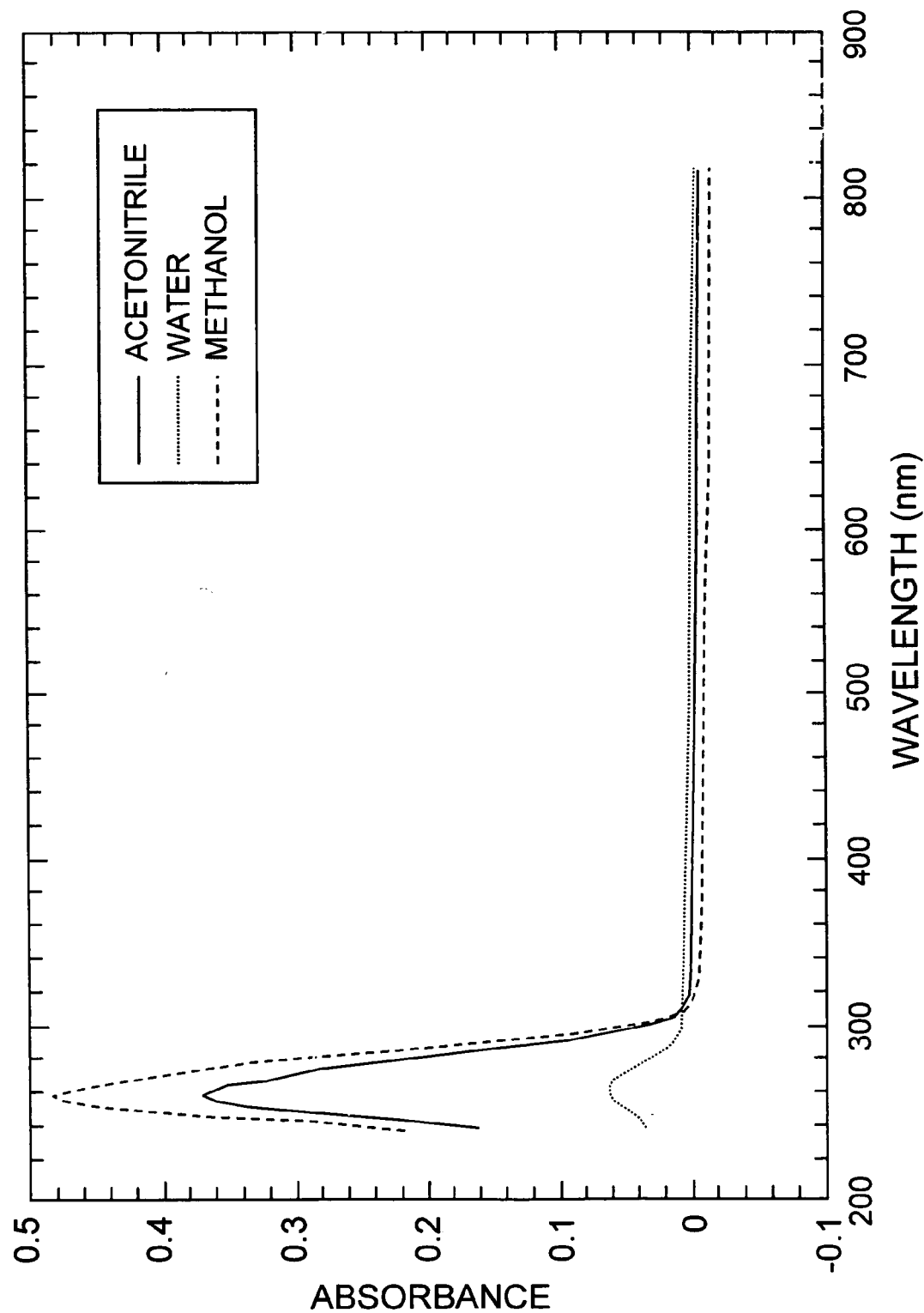
FIG. 2 compares the absorbance spectra of a film of neat ammonium-MePEG salt of herring testes DNA in two organic solvents, acetonitrile (solid line) and methanol (dashed line), as compared to water (dotted line).
Figure 3:
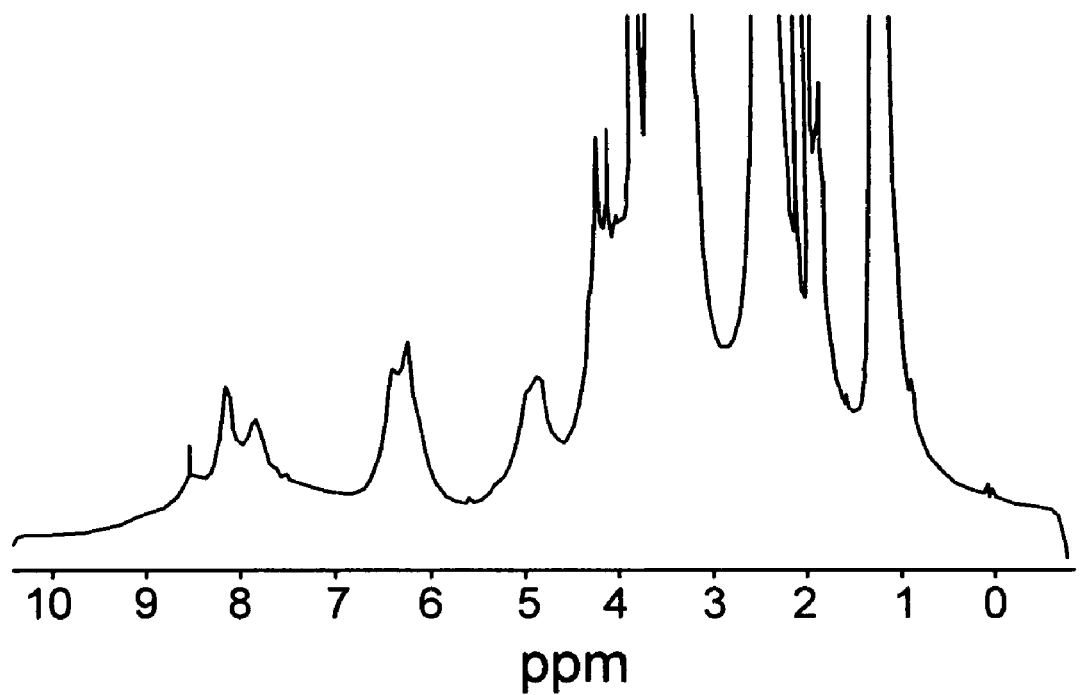
FIG. 3 shows the Proton NMR spectrum of ammonium-MePEG salt of herring testes (HT) DNA.
Figure 4:
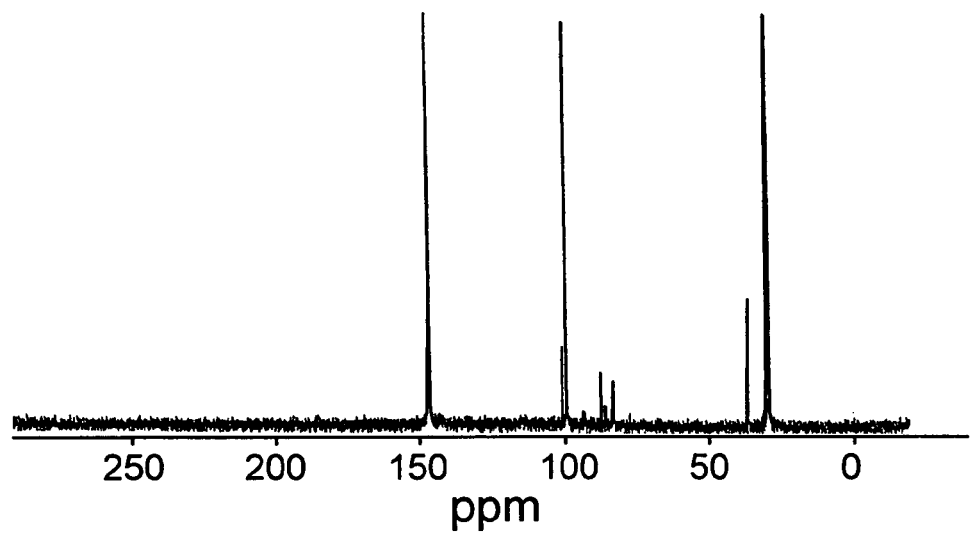
FIG. 4 shows the Carbon-13 NMR spectrum of ammonium-MePEG salt of herring testes DNA.
Figure 5:
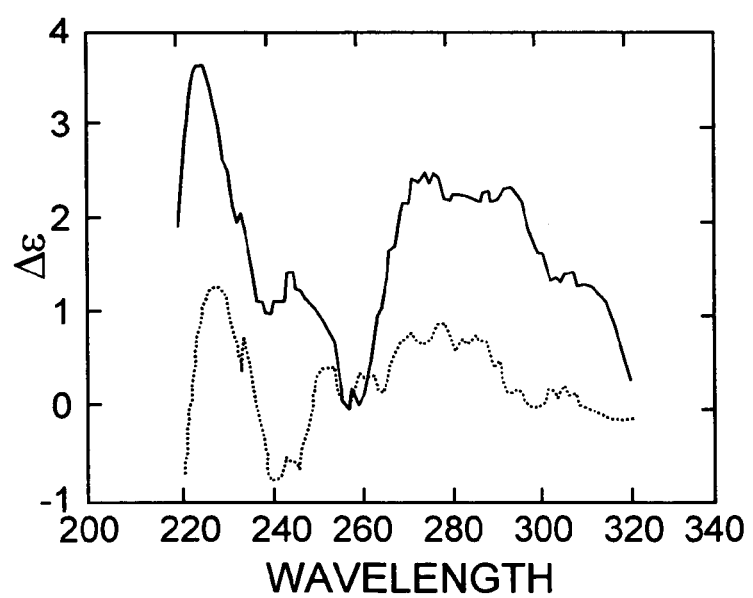
FIG. 5 shows the circular dichroism spectra of ammonium-MePEG salt of herring testes DNA in either water (solid line) or ethylene glycol (dotted line). Spectra are in units of $\Delta\epsilon$ ($Mol^{-1} \cdot cm^{-1}$) and wavelengths are in nanometers.

The salts of polynucleic acids formed by treatment with the cations described above exhibit a variety of properties. For example, the salt of DNA with the ammonium-MePEG cation (see Example 3) is soluble to approximately 1 mM (nucleotide phosphate) in dichloromethane and up to 75 mM in water. Shown in FIG. 1 is the absorption spectrum of the neat ammonium salt of herring testes (HT) DNA on a quartz microscope slide, and shown in FIG. 2 are the absorption spectra of the DNA in acetonitrile, water, and methanol. The proton NMR spectrum is shown in FIG. 3 and exhibits resonances for sugar and base protons in addition to the alkyl protons from the ammonium cation. As another example, salts of the present invention based on salts of polyether-decorated transition metal complexes with DNA undergo catalytic electron transfer reactions and thereby deliver electrons to microelectrodes from the neat DNA liquid. The DNA in the liquid is preferably double-stranded, and the electrochemistry is preferably performed under vacuum on microelectrodes or arrays of microelectrodes. These features are useful for microelectronic circuits that utilize molten salts for both self-assembly and electronic connections. Salts of the present invention also show solubility in a wide range of solvents, and both the dissolved forms and the neat melts are amenable to spectroscopic analysis. DNA may be recovered from the salts and shown to be double-stranded. Salts of the present invention are readily manipulated. For example, they can be deposited onto microelectronic circuits, placed under vacuum, and undergo chemical reactions normally observed in dilute solution.

Salts of the present invention also show useful electronic properties. An electron transfer reaction can be observed when the polyether cation is thermodynamically capable of oxidizing guanine. Numerous pathways for electron transfer exist in the salts, because electrons can transfer from the guanine to the metal, from guanine to an oxidized guanine, and from metal to metal. While guanine-guanine electron transfers may occur within a single DNA molecule along the long axis, or may occur over two or more DNA molecules, efficient electron transfer along DNA is not required.

The products of the invention are useful in a variety of applications. For example, compositions of the present invention may allow for separations of nucleic acids in non-aqueous media by chromatography (e.g., normal phase chromatography), electrophoresis, and microfluidic devices. Additionally, novel biochemistry experiments may be carried out with the materials in neat form or when dissolved in unusual non-aqueous solvents. Using novel molten salts of the present invention, synthetic manipulations that are limited to organic solvents can be performed where DNA is a reactant, for example.

As another example, compositions of the present invention form novel conductive or semi-conductive materials for fabrication of devices, including molecular electronic devices, which may be useful for enhancement of DNA electron transfer detection, for liquid crystal technology, as memory devices, as molecular diodes, switches and transistors, as computational devices such as counters, as conductive wires and other connectors, just to name a few such applications.

Yet another example of uses for compositions of the present invention includes coating substrates with compounds of the present invention containing one member of a specific binding pair, which may be useful for nucleic acid assays, for combinatorial chemistry screening, and for separations of nucleic acids from cell extracts, just to name a few applications.

Various substrates may be coated with compositions of the present invention as will be understood by those skilled in the art. Suitable substrates include, but are not limited to, metal substrates, semiconductor substrates, polymeric substrates, and inert materials such as silica and glass. Metal substrates that may be coated with compositions of the present invention include, but are not limited to, aluminum, iron, copper, steel, zinc, chromium, tin, indium, nickel, cobalt, and titanium and their alloys and oxides. Suitable semiconductor substrates include, but are not limited to, silicon, silicon dioxide, silicon nitride, silicon carbide, glasses, gallium arsenide, gallium antimonide, indium arsenide, indium antimonide, germanium, aluminum and various other elemental and compound semiconductors. Polymeric substrates may be inorganic or organic polymer substrates. Suitable polymeric substrates include, but are not limited to, acrylics, polyesters, polyethylenes, polypropylenes, polybutylenes, polyurethanes, vinyls, and butadiene acrylonitrile, to name just a few. Substrates may include a single one of the foregoing materials, may include a mixture of two or more of the foregoing materials, or may be formed as a sandwich including layers of single and/or mixed materials.

Substrates may be coated with compositions of the present invention using various processes understood by those skilled in the art, including, but not limited to, dip coating, spin coating, spraying, and brushing, among others.

The present invention includes electron transfers between metal complex and DNA (or other biomolecules) that occur by absorption of a photon (rather than being driven by an electrode). Optical (so-called vertical) electron transfers generally are low-probability events, but in a melt where the electron acceptor and donor are forced into continued proximity, they can be observed. This is simple to do. For example, one may simply photolyze $Ru(bpy)_3^{2+}$ with an electron acceptor such as $Fe(CN)_6^{3-}$. The $Ru(bpy)_2^{3+}$ excited state then reduces the Fe(III) to Fe(II) to generate ground-state Ru(III), which oxidizes guanine. See, e.g., Szalai, V. A.; Thorp, H. H. J. Am. Chem. Soc. 2000, 122, 4524–4525 and Stemp, E. D. A.; Arkin, M. R.; Barton, J. K. J. Am. Chem. Soc. 1997, 119, 2921–2925. Thus, a device of the present invention may incorporate a single electrode, and utilize an optical connection in place of a second electrode.

Figure 8:
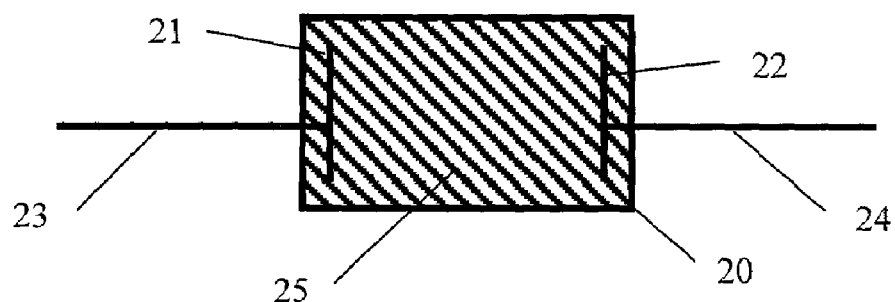
FIG. 8 is a schematic illustration of one embodiment of a device of the present invention.

An example of one embodiment of an electrical device of the present invention is illustrated in FIG. 8. The device comprises an enclosed chamber 20, a first electrode 21 positioned in the enclosed chamber (which may be a sealed chamber or in some embodiments may be exposed), and a second electrode 22 positioned in the enclosed chamber (the second electrode could be eliminated and replaced with an optical connection as noted above). Appropriate electrical connectors 23, 24 are connected to the first and second electrodes. A molten salt 25 as described above is contained in the enclosed chamber, and is in electrical contact with the first and second electrode. No covalent or other strong chemical bonds between the molten salt and the electrode need be formed, and the molten salt may be present in the device in amorphous form. The device may be used, for example, as an electrical memory device. The structure, geometry and manner of manufacture of the device, and manner of connection to the device, is not critical, and can be done in any of a variety of manners, including but not limited to those described in U.S. Pat. Nos. 6,128,214 and 6,256,767, the disclosures of which are incorporated by reference herein in their entirety. For example, the electrodes may be formed on or of semiconductor substrates, and the electrical connection to the electrodes may be formed by simply applying or depositing the molten salt to the substrate.

Figure 9:
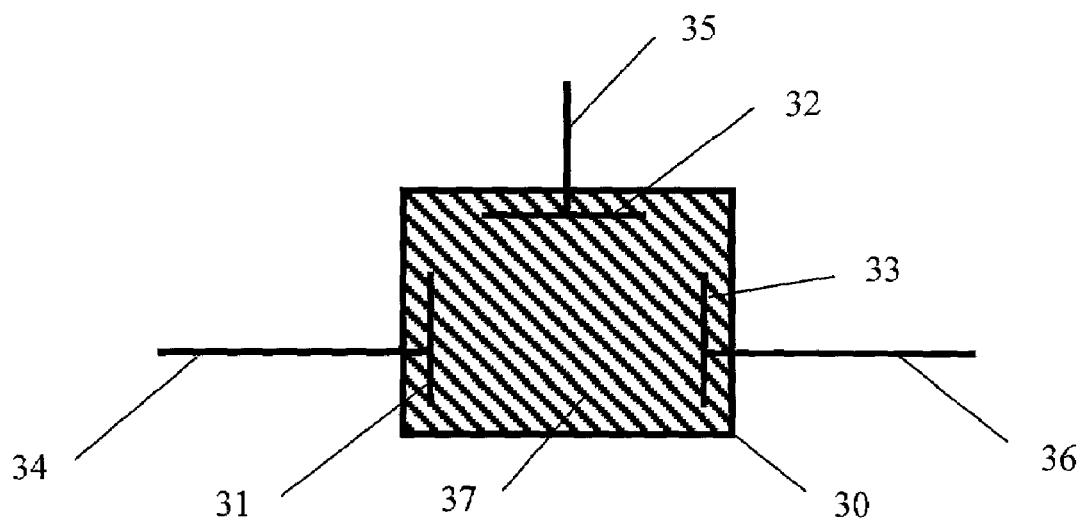
FIG. 9 is a schematic illustration of a second embodiment of a device of the present invention.

Another example of an embodiment of a device of the present invention is given in FIG. 9. The device comprises an enclosed chamber 30, a first electrode 31 positioned in the enclosed chamber (which may be a sealed chamber or in some embodiments may be exposed), a second electrode 32 positioned in the enclosed chamber, and a third electrode 33 positioned in the enclosed chamber. Appropriate electrical connectors 34, 35, 36 are connected to the electrodes. A molten salt 37 as described above is contained in the enclosed chamber, and is in electrical contact with the electrodes. Again, no covalent or other strong chemical bonds between the molten salt and the electrode need be formed, and the molten salt may be present in the device in amorphous form. The device may be used, for example, as a memory device or a transistor. Again the device may be manufactured and configured in any suitable manner, including but not limited to that described in S. Chao and M. Wrighton, J. Am. Chem. Soc. 109, 2197–2199 (1987).

The present invention is explained in greater detail in the following non-limiting Examples.

EXAMPLE 1

Tosylation of Polyethylene Glycol Methyl Ether

All reagents were purchased from Sigma-Aldrich. Polyethylene glycol methyl ether ($MePEG_{350}$) was dried in vacuum at 70° C. for 24 hours prior to reaction. Pyridine was dried by passing over activated alumina and stored on molecular sieves. A sample of p-toluenesulfonyl chloride (12.5 g, 65.6 mmol) was added to a 300-mL three neck round bottom flask. The flask was evacuated and purged with nitrogen. Dry pyridine (20 mL) was added and the mixture stirred at 0° C., producing a thick, white slurry. A mixture of 19.2 g (50.4 mmol) $MePEG_{350}$ and 10 mL of dried pyridine were added dropwise to the flask at approximately 1.5 mL/min. After complete addition of the $MePEG_{350}$, stirring at 0° C. continued for 2 hours and an additional 4 hours at room temperature at which time the tosylation reaction was complete. The mixture was poured into 125 mL nanopure water (0° C.) and extracted with an equal volume of methylene chloride (0° C.). The water layer was discarded and the organic phase extracted three times with 6 M HCl (0° C.) to remove excess pyridine. The resulting pale yellow solution of methylene chloride was stirred over anhydrous sodium sulfate for 0.5 hours. The salt was filtered by gravity, and the methylene chloride removed by rotary evaporation. A viscous pale yellow oil remained. NMR integrations were used to confirm complete reaction of $MePEG_{350}$. 31.8 polymer protons at δ 3.0–4.0 ppm (multiplet) normalized to 4 tosyl protons at δ 7.4–7.8 ppm (doublet of doublets) is indicative of complete reaction.

EXAMPLE 2

Reaction of $MePEG_{350}$ Tosylate with Triethylamine

Triethylamine was dried on molecular sieves after passing through an activated alumina column. $MePEG_{350}$ tosylate was dried in vacuum for at least 12 hours prior to reaction. 15 g $MePEG_{350}$ tosylate (28.8 mmol) were stirred vigorously under nitrogen with 50 mL dry triethylamine at gentle reflux. Stirring proceeded for 36 hours. The two solvent layers gradually combine forming a single caramel colored solution, signaling complete reaction. The excess triethylamine was removed by rotary evaporation, producing a yellow-orange oil. Proton NMR in $CDCl_3$ indicates 9 protons at δ 1.3 ppm (triplet) normalized to 4 tosylate protons at δ 7.4–7.9 ppm (doublet of doublets). The product was added to 100 mL solution of 1.0 M HCl and purified by extracting repeatedly with 100 mL methylene chloride until the aqueous layer was colorless. The water volume was reduced to 25 mL by rotary evaporation. Anion exchange on a Dowex 1×8 strongly basic anion exchange resin eliminates the excess acid and produces the hydroxide salt, $(Et_3NMePEG_{350})(OH)$. The strongly basic solution that elutes from the column is immediately neutralized with an appropriate acid to produce the desired salt. Addition of HCl, $HBF_4$ or $HPF_6$ to produce the chloride, tetrafluoroborate, or hexafluorophosphate salt are typical. Proton NMR in $CDCl_3$ indicates 9 protons at δ 1.3 ppm (triplet) normalized to 31.8 polymer protons at δ 3.0–4.0 ppm (multiplet). No aromatic signal remained.

EXAMPLE 3

Dialysis with DNA

Millipore brand 100 MWCO dialysis tubing was soaked twice for 30 min in nanopure water. A solution of 41.0 mL of 49 mM sheared herring testes (HT) DNA (2.0 mmol) was added to 0.989 g of $Et_3N^+MePEG_{350}$ $Cl^-$ (2.0 mmol). The solution was diluted to 100 mL and added to dialysis tubing. Dialysis was executed for 1 week at refrigerated temperatures, for example 4° C. The 4-L reservoir was replaced every 12 hours. Following dialysis, water was removed by rotary evaporation. Extreme care was taken to remove all salt from glassware. Repeated rinsing with nanopure water was employed. Removal of water produces a very viscous transparent, pale yellow semi-solid. Drying under vacuum produces a soft glass like substance. Elemental analysis showed P=4.63, Na=0.20, Cl=0.87, and UV $\lambda_{max}$=260. Additional analysis is illustrated in FIGS. 1–5.

EXAMPLE 4

Synthesis of $bpy(CO_2MePEG_{350})_2$ Ligand

All reagents were purchased from Sigma-Aldrich. Teflon spatulas were used to avoid iron coordination to bipyridine compounds. 4-picoline was coupled to produce 4,4'-dimethyl 2,2'-bipyridine. 1 liter of 4-picoline and 30 g of 10% w/w Pd catalyst on activated charcoal was refluxed for 96 hours. The charcoal was hot filtered from the boiling mixture by vacuum filtration. The filtrate was concentrated to 150 mL by rotary evaporation, causing crystallization of a yellow-white solid. The solid was filtered by vacuum and recrystallized from ethyl acetate producing approximately 20 g of white needles. Carboxylation was accomplished in acidic $KMnO_4$. The 4,4'-dimethyl 2,2'-bipyridine was dissolved in 800 mL of 25% sulfuric acid and cooled in an ice bath. Slow addition of 40 g of $KMnO_4$ produced a purple solution. The mixture was removed from ice and stirred at reflux for 24 hours. A tan precipitate formed and the solution gradually lost its deep violet color. 0.5 g of sodium metabisulfite were added and stirred for an additional hour. The solution was filtered. The tan clay-like solid was dissolved in 250 ml 50% nitric acid and refluxed until all of the solid was dissolved and the solution colorless. Addition of 1 liter of nanopure water resulted in a white precipitate. The solution was filtered. Approximately 10 g white wet solid were collected. The 4,4'-dicarboxy 2,2'-bispyridine was dried for at least 12 hours at 70° C. under vacuum. The dry white solid was refluxed in 150 ml thionyl chloride under nitrogen for approximately 48 hours. A transparent yellow solution signals complete reaction to the acid chloride. Excess thionyl chloride was removed by vacuum distillation with gentle heating. The solid was kept stored under vacuum. 3.0 g of the acid chloride and 6.8 g of dry polyethylene glycol methyl ether 350 (less than 2:1 stoichiometric ratio as free PEG does not separate in chromatography) were refluxed under nitrogen in 100 ml anhydrous benzene for 24 hours. 20 ml of triethylamine was added to the flask to neutralize HCll. The light white solid that resulted was filtered and the filtrate concentrated under vacuum. A pale yellow oil remained. The product was purified on a silica gel column with acetone as eluent. Product elution was detected using $Fe(ClO_4)_2$ filter paper. Eluent was collected until it no longer produced a purple color on the filter paper. Acetone was removed under vacuum.

EXAMPLE 5

Metal Ligation

Coordination of Fe or Co to the derivatized bipyridine was accomplished by stirring 3.1 mol bipyridine with 1 mol of the metal(II) perchlorate in acetone for 1 hour. The solution was dried under vacuum producing a viscous liquid, purple for $Fe(II)(bpy(CO_2MePEG_{350})_2)_3(ClO_4)_2$ and golden for $Co(II)(bpy(CO_2MePEG_{350})_2)_3(ClO_4)_2$. Excess ligand was removed by repeatedly stirring the product vigorously in diethyl ether for 1 hour and pouring off the ether. Purity was confirmed by NMR. The Co(II) complex shows no aromatic protons when all excess ligand is removed. The iron complex contains three aromatic protons and 29.8 polymer protons. The ester linkage shifts the first 2 protons of the polymer chain downfield, distinguishing them from the remainder of the polymer protons.

EXAMPLE 6

Metal Bipyridine DNA

Cation exchange of native sodium for the metal bipyridines was achieved through dialysis in the same manner as for the $Et_3N^+MePEG_{350}$. A 2:1 ratio, base:metal complex was used. Sheared herring testes DNA was used and concentration in nanopure water determined by UV-vis spectrometry. Millipore brand 100 MWCO dialysis tubing was soaked twice for 30 minutes in nanopure water. The solution was diluted to 100 mL. Dialysis was executed for 1 week at refrigerated temperatures, for example 4° C. The 4-L reservoir was replaced every 12 hours. Following dialysis, water was removed by rotary evaporation. Extreme care was taken to remove all salt from glassware. Repeated rinsing with nanopure water was employed. Removal of water from the Fe complex produces a soft, plastic-like violet semisolid. The Co complex produced a yellow, brittle solid resembling cellophane. Elemental analysis for Fe DNA showed P=2.41%, Na-0.015%, and Fe=3.95%. Elemental analysis for Co DNA showed P=2.56%, Na=0.032%, and Co=4.11%. Elemental analysis for Co DNA also showed a purity of ≧90% with virtually no detectable sodium ion present, indicating that all of the DNA counterions had been replaced by $Co(MePEG-bpy)_3^{2+}$. The remainder of the Co complex composition is made up of perchlorate anion in place of DNA.

EXAMPLE 7

Cyclic Voltammogram of $Co(MePEG-bpy)_3$•DNA

Figure 6:
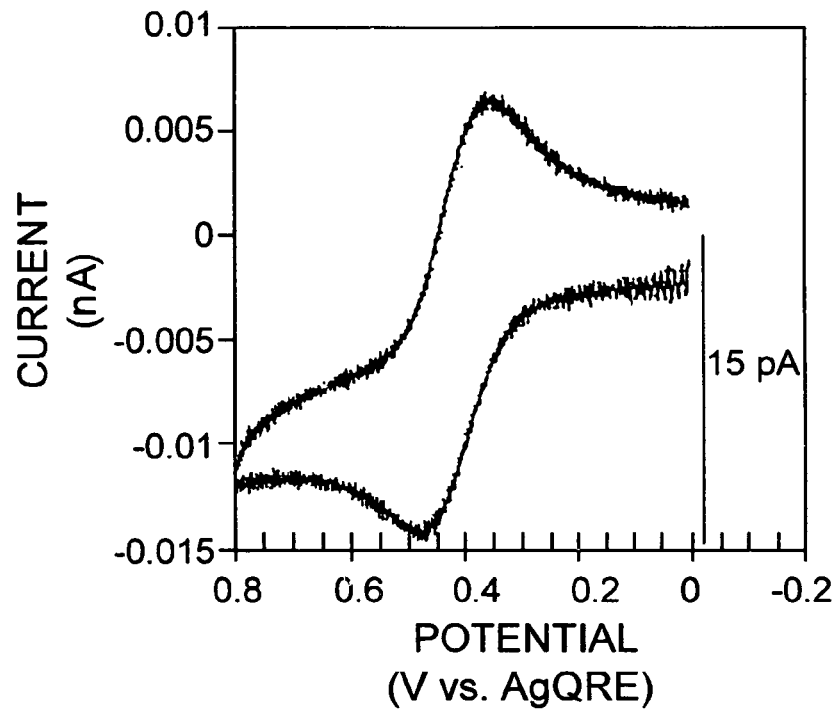
FIG. 6 illustrates a cyclic voltammogram of Co(MePEG-bpy)$_3$•DNA.

As illustrated in FIG. 6, a cyclic voltammogram of the $Co(MePEG-bpy)_3$•DNA melt showed a characteristic wave for the Co(III/II) couple at $E_{1/2}$=0.405 V. The currents were somewhat lower that those for a Co(MePEG-bpy)$_3$(ClO$_4$)$_2$ melt and gave a $D_{PHYS}$ for the DNA melt of $3.0 \times 10^{-12}$ cm$^2$/s, compared to a $D_{PHYS}$ for the perchlorate melt of $1.3 \times 10^{-11}$ cm$^2$/s. A slower $D_{PHYS}$ for the DNA melt compared to the perchlorate melt was expected, since the polymeric counterion leads to a higher viscosity. The only electrochemical signal for the Co-DNA melt was due to the Co(III/II) couple. This wave was chemically reversible, which was expected since Co(III) does not oxidize guanine.

EXAMPLE 8

DNA in Molten Salt is Double Stranded

The Co-DNA melt was dissolved in water, and the DNA fragments were separated on an agarose gel. The DNA fragments on the gel were 50–100 bp in length and stained well with ethidium bromide. Since heterogenous polynucleotides such as herring testes DNA cannot reanneal, this experiment shows that the DNA in the melt was double-stranded. To confirm this point, another melt was prepared using a polyether-decorated ammonium cation, which formed a 1:1 melt with DNA nucleotides, (CH$_3$CH$_2$)$_3$N(CH$_2$CH$_2$O)$_7$CH$_3$•DNA. This ammonium-DNA melt was characterized by elemental analysis and NMR, and was found to give a CD spectrum in water that was identical to that for native herring testes DNA (the Co-DNA melt could not be characterized by CD spectroscopy because the absorptions for the metal complex overlaid the DNA signals). This experiment further demonstrates that the DNA molecules in the melt remain double stranded. Because the ammonium-DNA melt contains a countercation that does not exhibit optical absorption in the 250–300 nm range, the melt could be placed between glass plates and scanned in an optical spectrometer.

EXAMPLE 9

Figure 7:
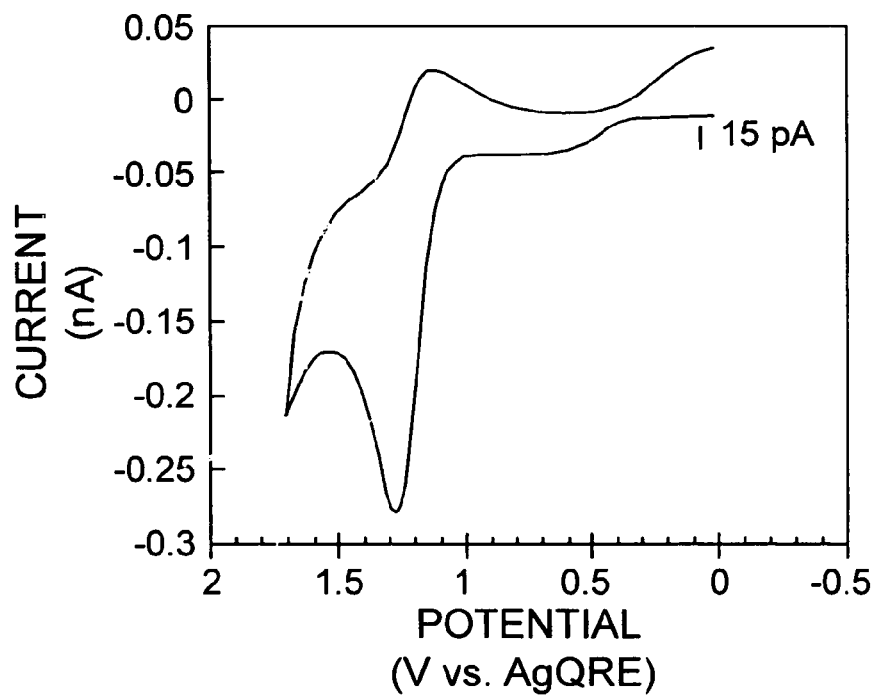
FIG. 7 illustrates a cyclic voltammogram of a mixture of Co(MePEG-bpy)$_3$•DNA and Fe(MePEG-bpy)$_3$(ClO$_4$)$_2$ in a 1:1 Co:Fe ratio.

Cyclic Voltammogram of 1:1 Mixture of Co(MePEG-bpy)$_3$•DNA and Fe(MePEG-bpy)$_3$(ClO$_4$)$_2$ A 1:1 mixture of Co(MePEG-bpy)$_3$•DNA and Fe(MePEG-bpy)$_3$(ClO$_4$)$_2$ was made. As illustrated in FIG. 7, a cyclic voltammogram of the mixture showed two electrical signals. The first signal (approximately 0.3 V) was believed to be due to the chemically reversible Co(III/II) wave, while the wave (approximately 1.3 V) for Fe(III/II) appeared to show a larger oxidative signal than a reductive signal, which is typical of electrocatalytic oxidation. Faster scanning gave a more reversible wave, and repeated scanning led to smaller oxidative currents on successive scans. Both of these features are also indicative of electrolytic oxidation of guanine. This behavior is ascribed to catalytic oxidation of guanine in DNA by the electrogenerated Fe(III) in the melt. The absolute currents in the Co/Fe/DNA melt may be lower than those in Co-perchlorate and Fe-perchlorate melts because diffusion is slower and because the amount of iron in the melt is lower. The Co(III/II) couple was used to determine a value of $D_{PHYS}$ for the Co/Fe/DNA melt of $5.7 \times 10^{-11}$ cm$^2$/s.

An experiment was performed to verify that guanines were the source of the electrons that gave the catalytic current in FIG. 7. The tailed Fe(III) complex was reacted with a radiolabeled oligonucleotide containing a single guanine. This reaction was performed by oxidizing the Fe(II) complex with Ce$^{4+}$ and mixing the resulting Fe(III) form with DNA in dilute aqueous solution. The DNA showed selective cleavage at the guanine residue following standard piperidine treatment and high resolution electrophoresis as known in the art. In addition, cyclic voltammetry of the Co-DNA melt and the ammonium-DNA melt in the absence of Fe showed no faradaic current at potentials up to 1.5 V, showing that direct oxidation of guanine at the electrode does not occur at a detectable rate. The catalytic current observed in FIG. 7 was therefore ascribed to oxidation of guanine by Fe(III) in the neat DNA melt.

EXAMPLE 10

Preparation of a Molten Protein

Millipore brand 100 MWCO dialysis tubing is soaked twice for 30 min in nanopure water. A solution of 41.0 mL of 49 mM polyglutamate (2.0 mmol) is added to 0.989 g of Et$_3$N$^+$MePEG$_{350}$ Cl$^-$ (2.0 mmol). The solution is diluted to 100 mL and added to the dialysis tubing. Dialysis is executed for 1 week at 4° C. The 4-L reservoir is replaced every 12 hours. Following dialysis, water is removed by rotary evaporation. Extreme care was taken to remove all salt from glassware. Repeated rinsing with nanopure water is employed. Removal of water produces a very viscous transparent, pale yellow semi-solid. Drying under vacuum produces a soft glass-like substance.

EXAMPLE 11

Preparation of Molten Polypeptide with Cationic Charge on the Polypeptide

Millipore brand 100 MWCO dialysis tubing is soaked twice for 30 min in nanopure water. A solution of 41.0 mL of 49 mM polylysine (2.0 mmol) is added to 1.07 g of [MePEG-BzSO$_3^-$][H$^+$] (2.0 mmol). The pH of the solution is adjusted to neutral with sodium hydroxide. The solution is diluted to 100 mL and added to the dialysis tubing. Dialysis is executed for 1 week at 4° C. The 4-L reservoir is replaced every 12 hours. Following dialysis, water is removed by rotary evaporation. Extreme care was taken to remove all salt from glassware. Repeated rinsing with nanopure water is employed. Removal of water produces a very viscous transparent, pale yellow semi-solid. Drying under vacuum produces a soft glass like substance.

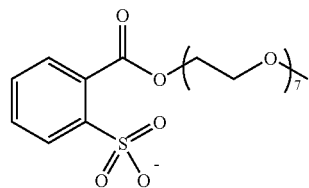

MePEG—BzSO$_3^-$

EXAMPLE 12

Molten Polystyrene Sulfonate

Millipore brand 1100 MWCO dialysis tubing is soaked twice for 30 min in nanopure water. A solution of 41.0 mL of 49 mM polystyrene sulfonate (2.0 mmol) is added to 0.989 g of $Et_3N^+MePEG_{350}$ $Cl^-$ (2.0 mmol). The solution is diluted to 100 mL and added to the dialysis tubing. Dialysis is executed for 1 week at 4° C. The 4-L reservoir is replaced every 12 hours. Following dialysis, water is removed by rotary evaporation. Extreme care was taken to remove all salt from glassware. Repeated rinsing with nanopure water is employed. Removal of water produces a very viscous transparent, pale yellow semi-solid. Drying under vacuum produces a soft glass like substance.

EXAMPLE 13

Preparation of Siloxane Melt

A liquid-forming cation is synthesized consisting of a positively charged group appended to poly(dimethylsiloxane), such as $(CH_3CH_2)_3NCH_2CH_2(OSi(CH_3)_2)_nOCH_3^+$, where n=7–25. The chloride salt of this cation is added to millipore brand 100 MWCO dialysis tubing that is soaked twice for 30 min in nanopure water. A solution of $Fe(CN)_6^{3-}$ is added to the dialysis tube such that there are three cation groups for each metal complex. The solution is diluted to 100 mL. Dialysis is executed for 1 week at 4° C. The 4-L reservoir is replaced every 12 hours. Following dialysis, water is removed by rotary evaporation. Extreme care is taken to remove all salt from glassware. Repeated rinsing with nanopure water is employed. Removal of water produces a very viscous transparent, pale yellow semi-solid, $[(CH_3CH_2)_3NCH_2CH_2(OSi(CH_3)_2)_nOCH_3]_3Fe(CN)_6$. Drying under vacuum produces a soft glass-like substance.

The foregoing is illustrative of the present invention, and is not to be construed as limiting thereof. The invention is defined by the following claims, with equivalents of the claims to be included therein.

That which is claimed is:

1. An electrical memory device, said memory device comprising:
   (a) a first electrode; and
   (b) a storage medium electrically coupled to said electrode, said storage medium comprising an ionic liquid melt, said ionic liquid melt comprising at least a first redox active compound;
   wherein said ionic liquid melt is a salt of an organic polymer ion and a polyether or polysiloxane counterion,
   said organic polymer ion selected from the group consisting of polypeptides, polynucleic acids, polystyrenes, and polysaccharides,
   and wherein at least one of said organic polymer ion and said counterion is redox active.

2. The device according to claim 1, further comprising a second electrode electrically coupled to said storage medium.

3. The device according to claim 1, wherein said storage medium is contained within an enclosed chamber.

4. The device according to claim 1, wherein said storage medium is contained within a sealed chamber.

5. The device according to claim 1, wherein said counterion comprises a polyether selected from the group consisting of polyethylene glycol and polypropylene glycol.

6. The device according to claim 1, wherein said counterion comprises a polysiloxane.

7. The device according to claim 1, said ionic liquid melt further comprising a second redox active compound that together with said first redox active compound form a redox active pair.

8. The device according to claim 7, wherein said device is a refreshable memory device.

9. The device according to claim 1, wherein said storage medium is not covalently bonded to said first electrode.

10. The device according to claim 9, said ionic liquid melt having a glass transition temperature between −50° C. and 100° C.

11. The device according to claim 10, wherein said ionic liquid melt is amorphous.

12. An electrical device comprising:
   (a) a first electrode;
   (b) a second electrode; and
   (c) a medium electrically coupled to said first and second electrodes, said medium comprising an ionic liquid melt, wherein said ionic liquid melt is a salt of an organic polymer ion and a polyether or polysiloxane counterion,
   wherein said organic polymer ion is selected from the group consisting of polypeptides, polynucleic acids, polystyrenes, and polysaccharides,
   and wherein at least one of said organic polymer ion and said counterion is redox active.

13. The device according to claim 12, further comprising a third electrode electrically coupled to said medium.

14. The device according to claim 12, wherein said medium is contained within an enclosed chamber.

15. The device according to claim 12, wherein said medium is contained within a sealed chamber.

16. The device according to claim 12, wherein said counterion comprises a polyether selected from the group consisting of polyethylene glycol and polypropylene glycol.

17. The device according to claim 12, wherein said counterion comprises a polysiloxane.

18. The device according to claim 12, said ionic liquid melt further comprising a second redox active compound that together with said first redox active compound form a redox active pair.

19. The device according to claim 18, wherein said device is a refreshable memory device.

20. The device according to claim 12, wherein said medium is not covalently bonded to said first electrode.

21. The device according to claim 12, wherein said ionic liquid melt is amorphous.

22. The device according to claim 21, said ionic liquid melt having a gas transition temperature between −50° C. and 100° C.

23. An electrical device comprising:
   (a) a first electrode;
   (b) a second electrode;
   (c) a medium electrically coupled to said first and second electrodes, said medium comprising an ionic liquid melt, said ionic liquid melt comprising at least a first redox active compound, and having a glass transition temperature between −50° C. and 100° C.;
   wherein said ionic liquid melt is a salt of an organic polymer ion and a polyether or polysiloxane counterion,
   said organic polymer ion selected from the group consisting of polypeptides, polynucleic acids, polystyrenes, and polysaccharides,
   and wherein at least one of said organic polymer ion and said counterion is redox active.

24. The device according to claim 23, wherein said ionic liquid melt is amorphous.

25. The device according to claim 23, further comprising a third electrode electrically coupled to said medium.

26. The device according to claim 23, wherein said medium is contained within an enclosed chamber.

27. The device according to claim 23, wherein said medium is contained within a sealed chamber.

28. The device according to claim 23, wherein said counterion comprises a polyether selected from the group consisting of polyethylene glycol and polypropylene glycol.

29. The device according to claim 23, wherein said counterion comprises a polysiloxane.

30. The device according to claim 23, said ionic liquid melt further comprising a second redox active compound that together with said first redox active compound form a redox active pair.

31. The device according to claim 23, wherein said device is a refreshable memory device.

32. The device according to claim 23, wherein said medium is not covalently bonded to said first electrode.

33. A polymer composition comprising a salt of an organic polymer ion and a polyether or polysiloxane counterion;
    said organic polymer ion selected from the group consisting of polypeptides, polynucleic acids, polystyrenes, glycoproteins, and polysaccharides;
    wherein at least one of said organic polymer ion and said polyether counterion is redox active;
    and wherein said composition is a melt.

34. A method of depositing a material on a substrate, comprising the step of:
    coating at least one surface portion of a substrate with a composition according to claim 23.

35. The method according to claim 34, wherein said substrate is selected from the group consisting of metals, semiconductors, and polymeric materials.

36. A structure, comprising:
    (a) a substrate; and
    (b) a coating on said substrate, said coating comprising a composition according to claim 33.

37. The structure according to claim 28, wherein the substrate is an electrode.

38. A method of forming a structure, comprising the steps of:
    (a) forming a molten salt of a composition according to claim 33; and
    (b) applying said molten salt to a substrate to form a structure.

39. The method according to claim 38, wherein said substrate is an electrode.

40. A method of making a molten salt, said method comprising the steps of:
    (a) providing an organic polymer ion selected from the group consisting of polypeptides, polynucleic acids, polystyrenes, and polysaccharides;
    (b) providing a polyether counterion; and
    (c) combining said organic polymer ion with said polyether counterion to make a molten salt thereof in a molten phase.

41. The method according to claim 40, wherein said polyether counterion is selected from the group consisting of polyethylene glycol and polypropylene glycol.

* * * * *

UNITED STATES PATENT AND TRADEMARK OFFICE
CERTIFICATE OF CORRECTION

PATENT NO. : 7,033,674 B2  
APPLICATION NO. : 09/932196  
DATED : April 25, 2006  
INVENTOR(S) : Thorp et al.

It is certified that error appears in the above-identified patent and that said Letters Patent is hereby corrected as shown below:

Column 21,  
Line 30 should read -- composition according to claim 33. --

Column 22,  
Line 5 should read -- 37. The structure according to claim 36, wherein the --

Signed and Sealed this

Fifth Day of September, 2006

JON W. DUDAS  
*Director of the United States Patent and Trademark Office*